United States Patent
Xie

(10) Patent No.: US 9,570,342 B1
(45) Date of Patent: Feb. 14, 2017

(54) VIA STRUCTURE AND METHOD FOR ITS FABRICATION

(71) Applicant: Altera Corporation, San Jose, CA (US)

(72) Inventor: Yuanlin Xie, Fremont, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 14/158,646

(22) Filed: Jan. 17, 2014

(51) Int. Cl.
*H01L 21/768* (2006.01)
*H01L 23/52* (2006.01)
*H01L 23/522* (2006.01)

(52) U.S. Cl.
CPC ..... *H01L 21/76814* (2013.01); *H01L 23/5226* (2013.01)

(58) Field of Classification Search
CPC .......... H01L 21/76814; H01L 23/5226; H01L 2224/16225; H01L 2224/13147
USPC .......................... 438/667, 666, 618; 257/774
IPC ............................. H01L 21/667, 21/666, 21/618
See application file for complete search history.

(56) References Cited

U.S. PATENT DOCUMENTS

| 6,103,552 A | 8/2000 | Lin |
| 6,642,136 B1 | 11/2003 | Lee et al. |
| 6,818,545 B2 | 11/2004 | Lee et al. |
| 7,863,750 B2* | 1/2011 | Shiota et al. ................. 257/759 |
| 2004/0094841 A1* | 5/2004 | Matsuzaki et al. ........... 257/758 |
| 2006/0043594 A1* | 3/2006 | Lin ................ 257/758 |
| 2006/0292851 A1* | 12/2006 | Lin et al. ...................... 438/618 |
| 2008/0023836 A1* | 1/2008 | Watanabe ............... H01L 24/11 257/758 |

OTHER PUBLICATIONS encyclopedia2.thefreedictionary.com/wire.*

* cited by examiner

*Primary Examiner* — Karen Kusumakar

(57) ABSTRACT

In a preferred embodiment of the invention, the via comprises one or more stacks, each stack comprising a seed layer of a first electrically conducting material formed on a smooth surface; a trace of a second electrically material that is electroplated on the seed layer; a column in electrical contact with the trace, the column comprising a third electrically conducting material that is electroplated on the trace; and an insulating material on the substrate and trace, the insulating material having a smooth upper surface in which the column is exposed. Additional vias may be stacked in tiers one on top of the other with the seed layer of one via making non-rectifying electrical contact with the exposed column of the via below it. Methods for forming the via structure are also disclosed.

20 Claims, 5 Drawing Sheets

VIA STRUCTURE AND METHOD FOR ITS FABRICATION

BACKGROUND

The back-end structures of integrated circuits typically comprise multiple layers of patterned metal layers that are interconnected by vias. The metal layers are formed by alternately depositing insulating layers and metal layers on a semiconductor substrate and patterning each metal layer to define electrical traces that interconnect the devices formed in the semiconductor substrate. The layers are interconnected by etching or drilling holes in the insulating layers between the metal layers and filling the holes with an electrically conducting material such as copper or tungsten.

The process of etching or drilling holes in the insulating material uses a relatively large amount of the space available in the various back-end layers and the need to allow for a certain amount of additional space around the via for pads and/or for isolation consumes even more space.

SUMMARY

The present invention relates to a via that is formed without the need to etch or drill holes in the insulating layers that separate the metallization layers in a back-end structure.

In a preferred embodiment of the invention, the via comprises one or more stacks, each stack comprising a seed layer of a first electrically conducting material formed on a smooth surface; a trace of a second electrically material that is electroplated on the seed layer; a column in electrical contact with the trace, the column comprising a third electrically conducting material that is electroplated on the trace; and an insulating material on the substrate and trace, the insulating material having a smooth upper surface in which the column is exposed. Additional vias may be stacked in tiers one on top of the other with the seed layer of one via making non-rectifying electrical contact with the exposed column of the via below it.

In a preferred embodiment, the via is made by forming a seed layer on a substrate, the seed layer comprising a layer of a first electrically conducting material; forming an electrically conducting trace on the seed layer by electroplating a second electrically conducting material on the seed layer; forming a column in electrical contact with the trace by electroplating a third electrically conducting material in contact with the trace; removing the seed layer where it does not underlie the trace; forming an insulating layer on the trace, the column and the substrate; and forming a smooth upper surface on the insulating layer in which the column is exposed. This process may be repeated for as many vias as desired.

Numerous variations may be practiced in the preferred embodiment.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
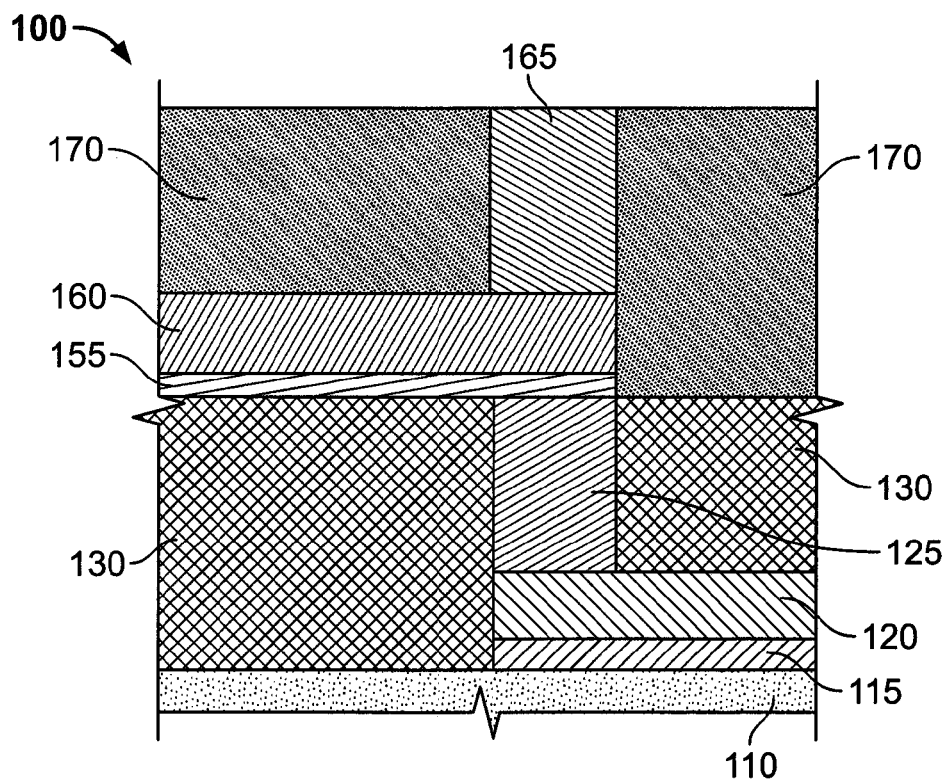
FIG. 1 is a cross-section of a via that is an illustrative embodiment of the invention.

FIG. 1 is a cross-section of an illustrative embodiment 100 of the invention. Embodiment 100 comprises a substrate 110, a seed layer 115, a trace 120, a column 125, and an insulating layer 130. It will be understood that for purposes of clarity in the drawings, these elements are not drawn to scale. For example, the thickness of an actual seed layer is considerably smaller than that of the trace, being about an order of magnitude thinner.

Seed layer 115, trace 120, and column 125 are formed of electrically conductive materials such as metals. Preferably, seed layer 115, trace 120 and column 125 are all the same metal and preferably the metal is copper. However, seed layer 115, trace 120, and column 125 may each be a different electrically conductive material, if desired. Preferably, insulating layer 130 is an epoxy resin such as bismaleimide triazine (BT) or an Ajinomoto build-up film (ABF).

Additional copies of the seed layer, trace, column and insulating layer may be formed in tiers one on top of the other, For purposes of illustration, one such copy is depicted in FIG. 1 where the elements of the copy comprise a second seed layer 155, a second trace 160, a second column 165, and a second insulating layer 170.

Figure 2:
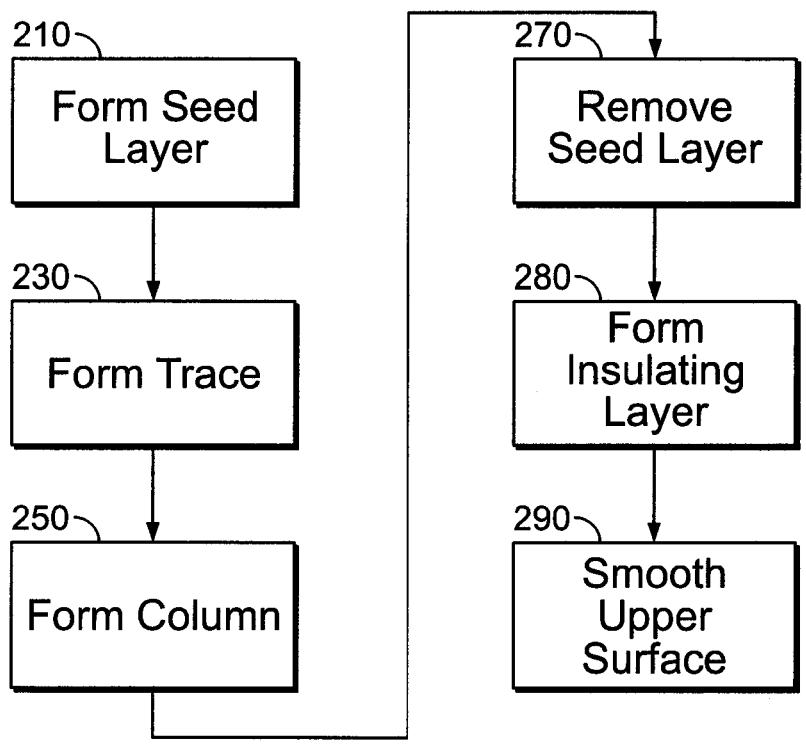
FIG. 2 is a flowchart of an illustrative embodiment of the invention.
Figure 3:
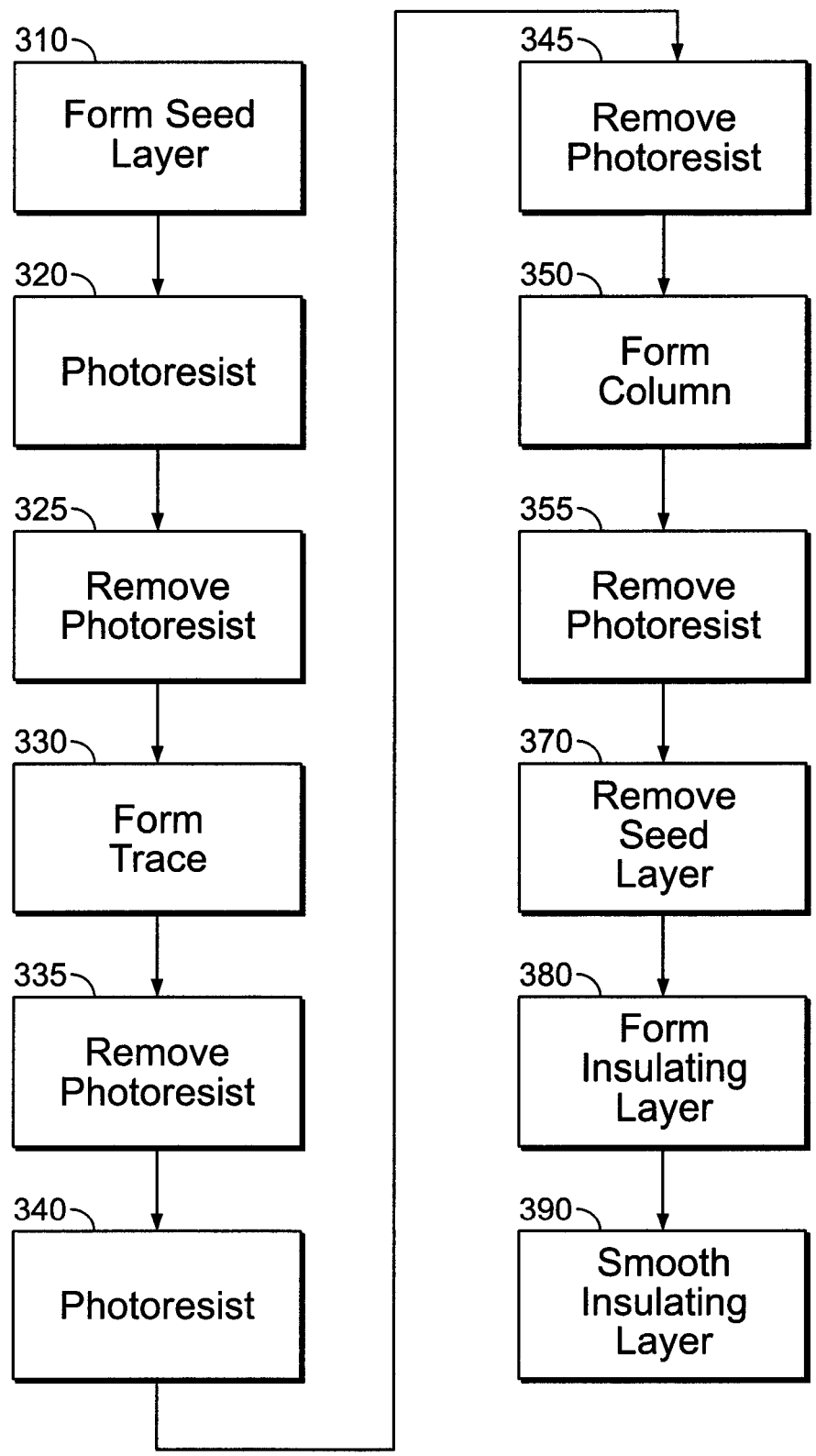
FIG. 3 is a more detailed flow chart of the embodiment of FIG. 2.

FIG. 2 is a flow chart depicting an illustrative embodiment of a method for making the via structure of FIG. 1. FIG. 3 is a more detailed version of the flow chart of FIG. 2. FIGS. 4-14 depict illustrative cross-sections of a via structure at certain steps in the process of FIGS. 2 and 3.

Illustratively, the process is performed on a substrate panel that may be a rectangular shape up to 16 to 24 inches on a side. Typically, numerous identical integrated circuits are formed simultaneously on the panel, each of which circuits includes one or more via structures of the type described herein. After processing of the panel is completed, the panel is broken apart into the individual integrated circuits.

As shown in FIG. 2, at step 210, a seed layer is formed on an upper surface of a substrate. The seed layer is an electrically conducting material such as copper. Next, at step 230, an electrically conducting trace is formed on the seed layer by electroplating a second electrically conducting material on the seed layer. A column of an electrically conducting material is then formed at step 250 in non-rectifying electrical contact with the trace by electroplating a third electrically conducting material. The seed layer is then removed at step 270 where it does not underlie the trace, thereby exposing the upper surface of the substrate except where the trace is formed. An insulating layer is then formed at step 280 on the trace, the column and the exposed upper surface of the substrate. Finally at step 290 a smooth upper surface is formed on the insulating layer in which the column is exposed.

Advantageously, these steps may be repeated as desired to form additional tiers of traces and columns one on top of the other with the seed layer of one tier making non-rectifying electrical contact with the exposed column of the tier below it.

Figure 4:
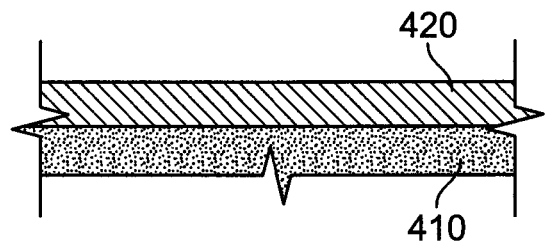
FIGS. 4-14 depict the formation of the via of FIG. 1 at various stages in the processes of FIGS. 3 and 4.

FIG. 3 is a more detailed flow chart of an illustrative embodiment of the invention. At step 310, a seed layer is formed on an upper surface of a substrate. The seed layer is an electrically conducting material such as copper. FIG. 4 is a cross-section depicting a substrate 410 on which a seed layer 420 has been formed.

Figure 5:
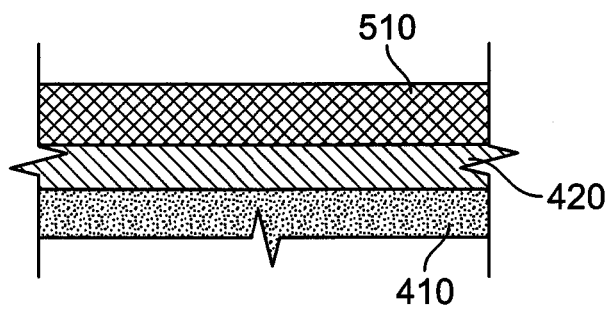
Figure 6:
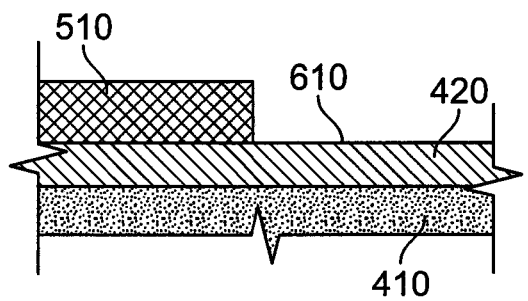
Figure 7:
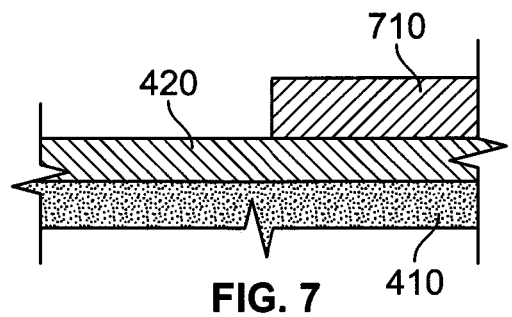

A layer of photoresist 510 is then formed at step 320 on seed layer 420 as shown in FIG. 5. Using conventional photolithographic processing steps, layer 510 is then exposed to a pattern of actinic radiation that defines in the photoresist the region where the trace is to be formed. As a result of this exposure process, the portions of photoresist where the trace is to be formed can be removed; and they are removed at step 325, thereby exposing a portion 610 of the underlying seed layer as shown in FIG. 6.

Next, at step 330, an electrically conducting trace is formed on the exposed portion of the seed layer by electroplating a second electrically conducting material on the seed layer. The remaining photoresist is then removed at step 335, leaving a structure having the cross-section shown in FIG. 7 in which a conducting trace 710 is formed on seed layer 420.

Figure 8:
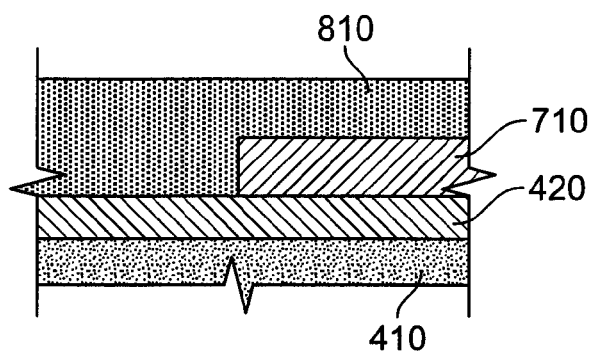
Figure 9:
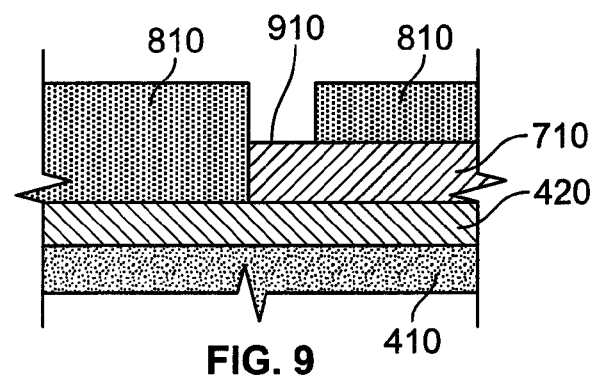
Figure 10:
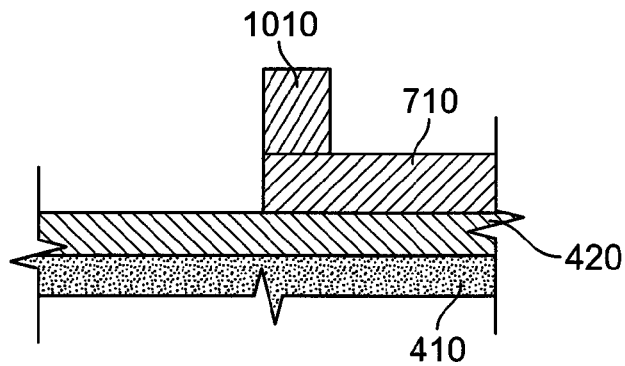

Another layer of photoresist 810 is then formed at step 340 on trace 710 and the exposed surface of seed layer 420 as shown in FIG. 8. Using conventional photolithographic processing steps, layer 810 is then exposed to a pattern of actinic radiation that defines in the photoresist the region where the column is to be formed. As a result of this exposure process, the portions of photoresist where the column is to be formed can be removed; and they are removed at step 345, thereby exposing a portion 910 of the underlying trace 710 as shown in FIG. 9.

Next, at step 350, an electrically conducting column 1010 is formed on exposed portion 910 of the trace by electroplating a second electrically conducting material on the exposed portion of the trace. The remaining photoresist is then removed at step 355, leaving a structure having the cross-section shown in FIG. 10.

Figure 11:
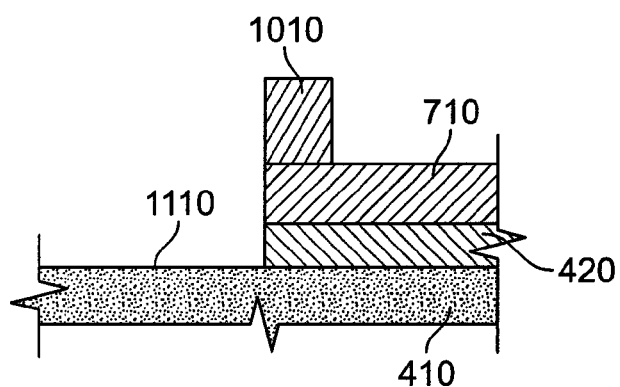
Figure 12:
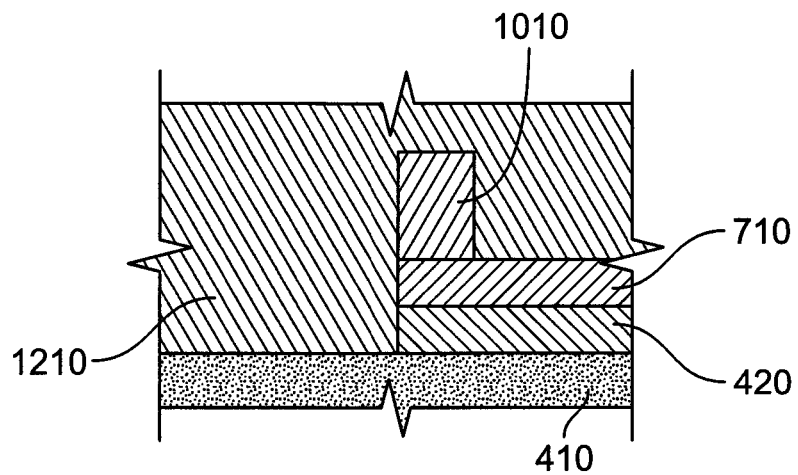
Figure 13:
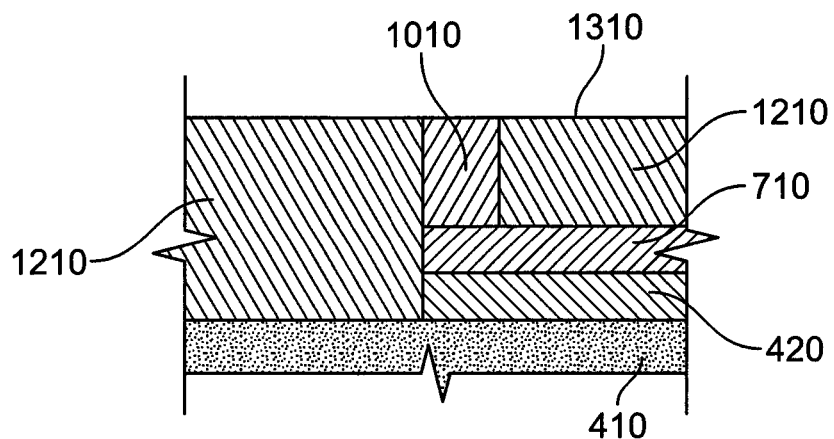

The seed layer is then removed at step 370 where it does not underlie the trace, thereby exposing an upper surface 1110 of the substrate as shown in FIG. 11 except where the trace is formed. An insulating layer 1210 is then formed at step 380 on the trace, the column and the exposed upper surface of the substrate as shown in FIG. 12. Finally at step 390, a smooth upper surface 1310 is formed on insulating layer 1210 as shown in FIG. 13. As is also shown in FIG. 13, the top of column 1010 is exposed in upper surface 1310.

Figure 14:
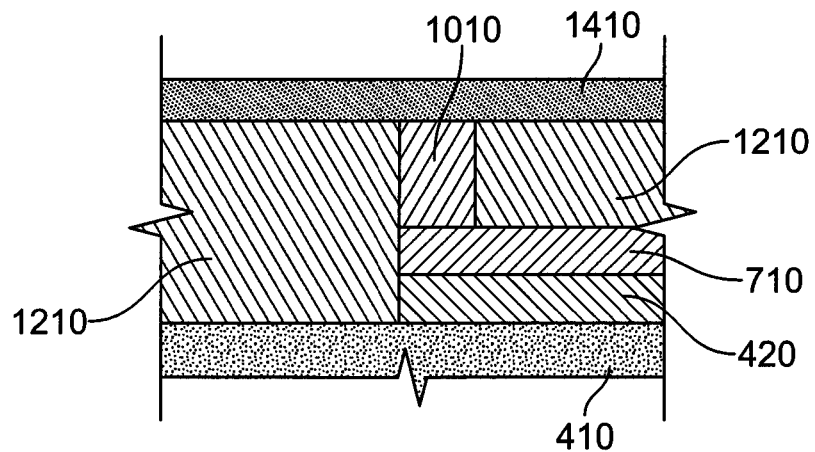

Advantageously, these steps may be repeated as desired to form additional tiers of traces and columns one on top of the other with the seed layer of one tier making non-rectifying electrical contact with the exposed column of the tier below it. FIG. 14 depicts the initial step in the process of forming another tier on top of the tier just completed. This step comprises the formation of a second seed layer 1410 on the upper surface 1310 of insulating layer 1210.

As will be apparent to those skilled in the art, numerous variations may be practiced within the spirit and scope of the present invention.

What is claimed is:

1. A method for forming a via comprising:
   forming a first seed layer on an upper surface of a substrate, the first seed layer comprising a layer of a first electrically conducting material;
   forming a first electrically conducting trace on the first seed layer by electroplating a second electrically conducting material on the first seed layer;
   forming a first column in electrical contact with the first trace by electroplating a third electrically conducting material in contact with the first trace;
   removing the first seed layer where the first seed layer does not underlie the first trace;
   forming an insulating layer on the first trace, the first column and the upper surface of the substrate;
   forming a smooth upper surface on the insulating layer in which the first column is exposed;
   forming a second seed layer, wherein the second seed layer is electrically conductive;
   forming a second electrically conductive trace on the second seed layer; and
   forming a second column in electrical contact with the second trace, wherein the second column is electrically conductive, wherein the second seed layer is in electrical connection with the first column, and wherein the second column is aligned with the first column along a vertical axis that is perpendicular to the upper surface of the substrate.

2. The method of claim 1 wherein the first seed layer and the first trace only extend in a first direction beyond an edge of the first column, and wherein the second seed layer and the second trace only extend in a second direction that is opposite to the first direction beyond an edge of the second column.

3. The method of claim 1 wherein the via is formed in a back-end structure.

4. The method of claim 1 wherein the first, second and third electrically conducting materials are the same.

5. The method of claim 1 wherein the first, second and third electrically conducting materials are copper.

6. The method of claim 1 wherein the smooth upper surface is formed by chemical mechanical polishing.

7. The method of claim 1 wherein the insulating layer is an epoxy resin.

8. A method for forming a via comprising:
   forming a first seed layer on a substrate, the first seed layer comprising a layer of a first electrically conducting material;
   forming a first photoresist layer on the first seed layer;
   removing a portion of the first photoresist layer to expose a portion of the first seed layer;
   forming a first electrically conducting trace on the exposed portion of the first seed layer by electroplating a second electrically conducting material on the first seed layer;
   removing the first photoresist layer;
   forming a second photoresist layer on the first trace and the first seed layer;
   removing a portion of the second photoresist layer to expose a portion of the first trace;
   forming a first column in electrical contact with the first trace by electroplating a third electrically conducting material in contact with the exposed portion of the first trace;
   removing the second photoresist layer;
   removing the first seed layer where the first seed layer does not underlie the first trace;
   forming an insulating layer on the first trace, the first column and the substrate;
   and forming a smooth upper surface on the insulating layer in which the first column is exposed;
   forming a second seed layer, wherein the second seed layer is electrically conductive, and wherein the second seed layer is in electrical connection with the first column;
   forming a second electrically conductive trace on the second seed layer; and
   forming a second column in electrical contact with the second trace, wherein the second column is electrically conductive, and wherein the second column is aligned with the first column along a vertical axis that is perpendicular to a surface of the substrate.

9. The method of claim 8 wherein the first seed layer and the first trace only extend in a first direction beyond an edge of the first column, and wherein the second seed layer and the second trace only extend in a second direction that is opposite to the first direction beyond an edge of the second column.

10. The method of claim 8 wherein the second and third electrically conducting materials are the same.

11. The method of claim 8 wherein the first, second and third electrically conducting materials are the same.

12. The method of claim 8 wherein the first, second and third electrically conducting materials are copper.

13. The method of claim 8 wherein the smooth upper surface is formed by chemical mechanical polishing.

14. The method of claim 8 wherein the insulating layer is an epoxy resin.

15. A via structure comprising:
   a substrate,
   a first seed layer of a first electrically conducting material;
   a first trace of a second electrically conducting material that is electroplated on the first seed layer;
   a first column in electrical contact with the first trace, the first column comprising a third electrically conducting material that is electroplated on the first trace;
   a first insulating material on the substrate and the first trace, the first insulating material having a smooth upper surface in which the first column is exposed;
   a second seed layer that is electrically conductive and that is formed on the upper surface of the first insulating material and in electrical contact with the first column;
   a second trace that is electrically conductive and that is electroplated on the second seed layer;
   a second column in electrical contact with the second trace, wherein the second column is electrically conductive and is electroplated on the second trace; and
   a second insulating material on an upper surface of the second trace, the second insulating material having a smooth upper surface in which the second column is exposed, wherein the second column is aligned with the first column along a vertical axis that is perpendicular to a surface of the substrate.

16. The structure of claim 15 wherein the first seed layer and the first trace only extend in a first direction beyond an edge of the first column, and wherein the second seed layer and the second trace only extend in a second direction that is opposite to the first direction beyond an edge of the second column.

17. The structure of claim 15 wherein the second and third electrically conducting materials are the same.

18. The structure of claim 15 wherein the first, second and third electrically conducting materials are the same.

19. The structure of claim 15 wherein the first, second and third electrically conducting materials are copper.

20. The structure of claim 15 wherein the first insulating material is an epoxy resin.

\* \* \* \* \*